United States Patent
Eibert et al.

(10) Patent No.: US 8,410,987 B2
(45) Date of Patent: Apr. 2, 2013

(54) METHOD AND DEVICE FOR MEASURING A RADIATION FIELD

(75) Inventors: Thomas Eibert, Munich (DE); Torsten Fritzel, Munich (DE); Carsten Schmidt, Munich (DE); Hans-Juergen Steiner, Munich (DE)

(73) Assignee: Astrium GmbH, Taufkirchen (DE)

( * ) Notice: Subject to any disclaimer, the term of this patent is extended or adjusted under 35 U.S.C. 154(b) by 332 days.

(21) Appl. No.: 12/938,972

(22) Filed: Nov. 3, 2010

(65) Prior Publication Data
US 2011/0102277 A1  May 5, 2011

(30) Foreign Application Priority Data
Nov. 4, 2009  (DE) .................. 10 2009 051 969

(51) Int. Cl.
*G01R 29/10* (2006.01)
(52) U.S. Cl. ............................................... 343/703
(58) Field of Classification Search .............. 343/703; 324/95, 106; 455/67.1
See application file for complete search history.

(56) References Cited

U.S. PATENT DOCUMENTS

| | | | |
|---|---|---|---|
| 4,704,614 A | 11/1987 | Poirier et al. | |
| 5,365,241 A | 11/1994 | Williams et al. | |
| 6,850,851 B1 * | 2/2005 | Fourestie et al. | 702/65 |
| 6,914,571 B1 * | 7/2005 | Lemanczyk et al. | 343/703 |
| 2003/0122078 A1 | 7/2003 | Fritzel | |
| 2009/0284425 A1 | 11/2009 | Snow et al. | |

FOREIGN PATENT DOCUMENTS
WO    WO 01/50145 A2    7/2001

OTHER PUBLICATIONS

Marta Maria Hernando, et al., "EMI Radiated Noise Measurement System Using the Source Reconstruction Technique", IEEE Transactions on Industrial Electronics, Sep. 2008, vol. 55, No. 9.

* cited by examiner

*Primary Examiner* — Hoang V Nguyen
(74) *Attorney, Agent, or Firm* — Crowell & Moring LLP

(57) ABSTRACT

A method for measuring a radiation field in the direct vicinity of a measured object is provided. One or more antenna measurement probe(s) are moved in any desired fashion within the radiation field, and a number of high-frequency measurement points is thus recorded. During the movement of the antenna measurement probe, a position determination of a respective antenna measurement probe is conducted simultaneously with or in close temporal proximity to the capture of a respective high-frequency measurement point, in order to assign a position to each high-frequency measurement point so as to generate a spatially defined measurement point cloud. Finally, radiation patterns at any distance from the measured object may be determined from the spatial measurement point cloud by means of a field transformation method.

17 Claims, 1 Drawing Sheet

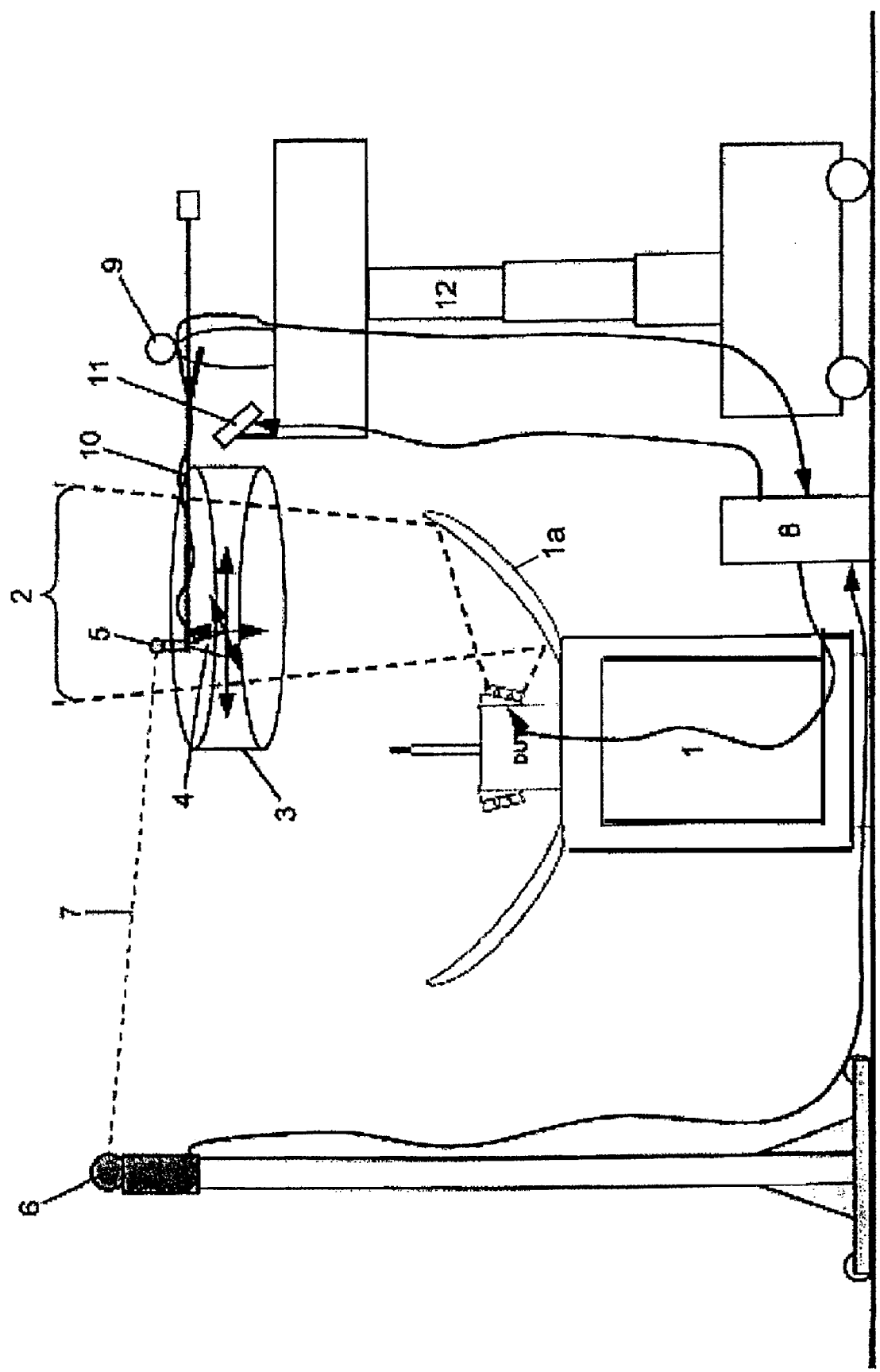

METHOD AND DEVICE FOR MEASURING A RADIATION FIELD

CROSS REFERENCE TO RELATED APPLICATIONS

This application claims priority under 35 U.S.C. §119 to German Patent Application No. 102009051969.6-35, filed Nov. 4, 2009, the entire disclosure of which is herein expressly incorporated by reference.

BACKGROUND AND SUMMARY OF THE INVENTION

The invention relates to a method and simplified device resulting therefrom for measuring a measured object, in particular antenna systems or entire objects into which the antenna systems have been integrated.

Antenna measuring systems are equipped with many devices specific to antenna measurement, some of which are very expensive. Moreover, due to their technical structure and size, the measuring systems are generally not portable. In order to measure a measured object such as, for example, an antenna, these measured objects must therefore always be brought to the measuring system and assembled there. Therefore, spontaneous and rapid on-site measurements of, for example, antennas that are small or have already been installed on satellites or aircraft are hardly possible.

For on-site measurements of an antenna, so-called test caps are commonly used that measure the reproducibility of the field strength of the antenna at a certain position. However, it is not possible to determine the radiation pattern of an antenna using such a test cap.

Moreover, WO 2001/050145 discloses the measurement of an antenna by means of a suspended platform. This platform is primarily provided for large antenna structures. However, the measurement of small antenna structures is difficult to accomplish using platforms of this type.

Exemplary embodiments of the present invention provide a method and a device that allow a more flexible measurement of a radiation field of a measured object such as, for example, an antenna. In particular, the method and device allow the measurement of the electromagnetic field in the direct vicinity of the antenna at any measurement points within a predetermined measurement volume and, using a rapid and precise field transformation, convert the measurement into spatially even and typically equidistant radiation pattern values at a freely selectable distance from the measured object.

These objects are attained by a method in accordance with the features of Claim 1 and a device in accordance with the features of Claim 13. Advantageous developments may be found in the subordinate claims.

Exemplary embodiments of the present invention provide a method by means of which one or more antenna measuring probes are moved within the radiation field, thus recording a number of high-frequency measurement points in any desired spatial distribution. During the movement of each antenna measuring probe, at least one position determination of the respective antenna measuring probe is made simultaneously with or in close temporal proximity to the respective measurement point being recorded in order to assign a position to each measurement point so as to obtain a spatially defined cloud of measurement points. The spatially defined measurement point cloud is then used to produce a radiation pattern for the measured object by means of a field transformation method.

The measurement method is particularly suitable for measuring small and mid-size objects to be measured such as, for example, antennas or diffusing objects, in a cost-effective fashion. The method creates preconditions for antenna or diffusion optimization and is suitable, for example, for troubleshooting by locally diagnosing antenna radiation properties in the course of maintenance and repair work such as, for example, on aircraft and satellites. One advantage of the method lies in the flexibility and low cost for the measurement of the radiation field of a measured object. In particular, using the field transformation method discussed above, the spatial measurement point cloud thus generated may also be used to obtain near-field and far-field radiation patterns of the measured object, which are commonly used in practice, comprising radiation pattern values with an even and typically equidistant spatial distribution.

During the movement of a respective antenna measurement probe, a high-frequency measurement is conducted in order to characterize the respective electromagnetic field components for the purpose of recording an individual measurement point. These measurement points are referred to as high-frequency measurement points.

In the measurement method described here, a special field transformation method is used that, in contrast to existing methods, is able to ascertain antenna radiation patterns from the measurement data clouds mentioned above in a reasonable period of time, at a reasonable cost, and with a sufficient level of precision, at any desired distance from the measured object. This field transformation method is based on a radiation integral calculation that traces the radiation field(s) back to suitable substitute source descriptions such as, for example, even waves or spatial electrical and magnetic current distributions and be able to generate the connection to the measured high-frequency signals via a typically hierarchical, multi-stage translation. Another particular characteristic of this method is the fact that it is able to take into account the influence of a respective antenna measurement probe on the signals to be measured in that each antenna measurement probe is only characterized using its far-field antenna pattern by magnitude and phase. Another characteristic of the field transformation method used here is that it is able to perform the calculation for generating the radiation patterns from "volume data" and not only from surface data. The transformation method used here optionally allows additional suppression of any spatial reflections that may occur.

According to another advantageous embodiment, each antenna measurement probe is provided with a position target, the position of which is detected using measurement technology in order to determine the position of the antenna measurement probe in question. In particular, a measuring laser beam or a measurement arm and/or an inertial measurement system, a geodetic measuring means, or a measurement method based on radio navigation is used to determine the position of the position target.

In the case of curved measurement volumes and/or in order to increase measurement quality, it is also possible for the orientation of the antenna measurement probe to be detected, in particular by expanding the position measurement system accordingly.

It is useful for the movement of a respective antenna measurement probe to be performed manually. Due to the portability of the antenna measuring probe and due to the hand-guided movements, the electromagnetic radiation field of the measured object may be detected in any fashion desired. The position of the measurement points within the measurement volume may be selected in virtually any desired fashion, with the positions always being detected using a highly precise position measurement system so as to be able to determine radiation patterns of the measured object by means of the field transformation method described here from the combination of position and recorded high-frequency measurement point.

According to an additional aspect, the density and distribution of the measurement points in the measurement of the measured object are continuously visualized on an output. When a respective antenna measurement probe is being moved by hand, this allows monitoring of the spaces or area segments in which measurement points have already been recorded and the spaces or area segments in which measurement points must still be recorded According to another aspect, the number of measurement points recorded is selected in such a way that the density and distribution of the measurement points meet the requirements of the field transformation method, which is based on a rapid radiation integral calculation and takes into account the influence of the measuring probe on the signals to be measured.

It is also useful for spatial reflection to be suppressed when determining the radiation pattern of the measured object. This allows a further improvement in the determination of the radiation pattern of the antenna.

According to another aspect, a respective antenna measurement probe is moved within a measurement volume that surrounds the radiation path of the measured object. Here, depending on the type of antenna, the antenna measurement probe(s) is/are moved within a flat measurement volume in front of the measured object or within an arced measurement volume around the measured object. The later process is particularly selected in the case of antennas having a non-bundling radiation characteristic.

In addition, exemplary embodiments of the present invention involve a device for measuring a radiation field of a measured object, in particular in its immediate vicinity. The device comprises one or more antenna measurement probes which are movable within the radiation field in order to record a number of high-frequency measurement points. It further comprises a position determination means by means of which, during movement of the antenna measurement probe in question, at least one position determination of the respective antenna measuring probe may be made simultaneously with or in close temporal proximity to the respective high-frequency measurement points being recorded in order to assign a position to each measurement point so as to obtain a spatially defined cloud of measurement points. A computation unit is also provided, by means of which at least one distance-dependent radiation pattern of the measured object, for example, near-field and far-field radiation patterns, may be determined from the spatial cloud of measurement points.

The device can also include a frequency-determining means by means of which a high-frequency measurement may be conducted during the movement of the antenna measurement probe for recording a respective measurement point.

According to an additional aspect, a respective antenna measurement probe is provided with a position target whose position may be captured using measurement technology in order to determine the position of the antenna measurement probe. In order to capture the position of the position target, a measuring laser beam, a measurement arm, and/or an inertial measurement system is provided. In principle, it is also possible for other position determination options to be used such as, for example, geodetic measurement means or measurement methods based on radio navigation.

It is useful for a respective antenna measurement probe to be pivotable by hand within the measurement volume, whereby the probe may be moved in a spatially flexible manner due to its portability in order to detect the radiation field, in particular in the direct vicinity of the measured object. Using a suitable field transformation method, it then becomes possible to calculate, for example, near-field and far-field radiation patterns of the measured object or antenna that are distance-dependent.

The invention shall be described in greater detail below with reference to an exemplary embodiment in the drawing.

Other objects, advantages and novel features of the present invention will become apparent from the following detailed description of one or more preferred embodiments when considered in conjunction with the accompanying drawings.

BRIEF DESCRIPTION OF THE DRAWINGS

The sole FIGURE shows a schematic depiction of a device for measuring a radiation field of a measured object and transforming the measurement point cloud thus measured into near-field and far-field radiation patterns that are distance-dependent.

DETAILED DESCRIPTION OF THE DRAWINGS

The measured object 1 in the FIGURE, is, for example, a telecommunications satellite. Its antenna 1a, shown on the right-hand side of the FIGURE, is to be measured. The antenna 1a generates a relatively highly bundled electromagnetic radiation field 2 that may be captured sufficiently using a preferably horizontal scanning volume. An antenna probe 4, provided with a position target 5, is moved along with the position target 5 within the energetically relevant measurement volume 3. In so doing, a plurality of measurement points is recorded in that a high-frequency measurement is performed for each measurement point. The radiation field of the antenna 1a has been completely measured when the number of measurement points has been selected such that the spatial density and distribution of measurement points thus obtained meets the requirements of the field transformation method used.

Corresponding to the necessary or predetermined measurement points, a positional measurement of the antenna measurement probe 4 is made simultaneously with the recording of measurement points during the movement of the antenna measurement probe 4. In order to determine the position of the antenna measurement probe 4, a positional measurement system may be used that comprises, for example, a so-called laser tracker. The laser tracker comprises a base unit 6, which measures the position of the antenna measurement probe in a highly precise fashion using a measuring laser beam 7 and the position target 5 attached to the antenna measurement probe 4. However, other positional measurement devices may also be used, such as so-called measurement arms, for example.

For antennas having a bundling radiation field, the antenna measurement probe 4 is preferably moved perpendicularly to the spread of the radiation field 2 within an energetically relevant measurement volume 3, as is shown by the arrows in the measurement volume 3. For non-bundling antennas or omnidirectionally reflecting objects, the antenna measurement probe may be guided around the measured object 1 or its antenna 1a. The field transformation method used allows the use of measurement points that are located at any point within a measurement volume and not along a surface. This characteristic contributes substantially to the simplification of the measurement because an additional degree of spatial freedom may be used in guiding the antenna measurement probe.

For arced measurement volumes and/or in order to increase the quality of the measurement data, it is possible for the orientation of the antenna measurement probe 4 to be additionally detected using, for example, an expanded positional measurement system. The positional and, optionally, orientation data are recorded along with the measurement points (i.e., the high-frequency data) using a computation unit 8. The computation unit 8 includes a processor and may be located in a corresponding cabinet (rack) for this purpose. The corresponding high-frequency measuring devices such as, for example, transmitters and receivers, for recording the spatially distributed measurement points are also disposed in this cabinet, for example. Moreover, it is also possible for other units for the suppression of spatial reflections to be provided in the cabinet if the measurements are not conducted in high-frequency-absorbing rooms.

The scanning of the electromagnetic antenna field is conducted by a person 9 in the exemplary embodiment. This person moves a portable antenna measurement probe 4 over an extension 10 back and forth horizontally and vertically. Using an output means 11, for example, a display, the person 9 conducting the measurement is able to see how completely the measurement volume 3 has already been scanned. Using the display 11, it is possible to see the locations at which additional scans must be performed. The person 9 conducting the measurements stands, for example, on a movable working platform 12 by means of which the person with the antenna measurement probe 4 may be moved as close to the location as possible. The field scanning may also be conducted using devices that are not specific to antennas such as, for example, manual or motor-driven auxiliary means up to any existing lifting, transport, crane, and robotics systems.

As soon as scanning of the radiation field has been completed, the measurement data (high-frequency data and positional data, any orientation data of the antenna measurement probe) are converted using the computation unit 8 into an antenna radiation pattern. In particular, the measurement data (i.e., the measurement point cloud) may be used to determine the far-field as well as near-field radiation patterns for different distances from the measured object using the field transformation method described here. The measurement data may also be stored, processed, and transformed into an antenna radiation pattern on a computation unit other than the computation unit 8 shown here.

The method according to the invention has the advantage that the portable antenna measurement probe 4 moved in space may be positioned in virtually any manner desired, which is not possible in antenna near-field measurement systems in the prior art. In order to be able to determine the radiation pattern for the antenna, high-frequency data and the position of the antenna measurement probe(s) are captured simultaneously or in close temporal proximity for each measurement. Using the spatial measurement point cloud thus generated in front of or around the measured object, it is possible for the desired radiation patterns to be calculated at any desired distance from the antenna in a reasonable amount of time, at a reasonable costs, and with sufficient precision. In particular, the calculation of far-field radiation patterns is possible, which are ultimately of interest in most cases.

The invention is characterized by a high degree of flexibility due to the portability of the device for measuring the transmission field and/or the receiving characteristic of antennas or dispersing objects. This results in lower costs for the measurement of the relevant radiation field. In particular, the method described here is suitable for measuring small and mid-size antennas which are attached to satellites or aircraft, for example. The method and the device may be used for antenna optimization and troubleshooting as well as for the local diagnosis of antenna radiation characteristics.

The invention uses a method for measuring a direct, reflected, or dispersed radiation field of a measured object by measuring measurement points having any desired spatial distribution, preferably in the direct vicinity of the measured object and within a three-dimensional measurement volume that surrounds the radiation field to be measured of the measured object. In particular, the measured objects are free-standing antenna structures, or antenna structures that are integrated into an object. Here, for each measurement point, it is preferable for the respective electromagnetic field components to be measured using one or more antenna measurement probes and, simultaneously or in close temporal proximity, the precise spatial position of the antenna measurement probe(s) to be determined. In order to improve the measurement results, it is also possible for the orientation of the antenna measurement probe(s) to be determined. Using the measurement point cloud thus defined in an electromagnetic and spatial fashion, antenna radiation patterns are determined using the field transformation method described below at any desired distance from the measured object, which in practice includes known near-field and far-field patterns.

In the measurement method described here, a special field transformation method is used that, in contrast to existing methods, is able to determine antenna radiation patterns at any desired distance from the measured object from the measurement data clouds mentioned above in a reasonable amount of time, at a reasonable cost, and with sufficient precision. This field transformation method is based on a rapid radiation integral calculation that traces the radiation field(s) back to suitable substitute source descriptions such as, for example, even waves or spatial electrical and magnetic current distributions and is able to generate the connection to the measured high-frequency signals via a typically hierarchical, multi-stage translation. Another particular characteristic of this method is the fact that it is able to take into account the influence of a respective antenna measurement probe on the signals to be measured in that each antenna measurement probe is only characterized using its far-field antenna pattern by magnitude and phase. Another characteristic of the field transformation method used here is that it is able to perform the calculation for generating the radiation patterns from "volume data" and not only from surface data. The transformation method used here optionally allows additional suppression of any spatial reflections that may occur. Moreover, all types of free-standing or integrated antennas for transmitting or receiving operation and dispersing measuring objects may be characterized using radiation technology.

The foregoing disclosure has been set forth merely to illustrate the invention and is not intended to be limiting. Since modifications of the disclosed embodiments incorporating the spirit and substance of the invention may occur to persons skilled in the art, the invention should be construed to include everything within the scope of the appended claims and equivalents thereof.

LIST OF REFERENCE NUMBERS

1 Measured object
2 Radiation field
3 Radiation volume
4 Antenna measurement probe
5 Position target
6 Position determination means (laser tracking system)
7 Measuring (laser) beam
8 Computation unit
9 Person
10 Extension 11 Output means (display)
12 Working platform

What is claimed is:

1. A method for measuring a radiation field in an immediate vicinity of a measured object, wherein
one or more antenna measurement probes are moved within the radiation field and a plurality of spatially distributed high-frequency measurement points are recorded;
during the movement of the antenna measurement probe, at least one position determination of a respective antenna measurement probe is conducted simultaneously with or in close temporal proximity to the capture of each high-frequency measurement point, in order to assign a position to each high-frequency measurement point so as to obtain a spatially defined measurement point cloud;
at least one radiation pattern is determined at any desired distance from the measured object from the spatially recorded measurement point cloud using a field transformation method.

2. The method according to claim 1, wherein the field transformation method involves a rapid radiation integral calculation that traces the radiation field(s) back to suitable substitute source descriptions that are even waves or spatial electrical and magnetic current distributions and generates the connection to the measured high-frequency signals via a particularly hierarchical, multi-stage translation.

3. The method according to claim 1, wherein a respective antenna measurement probe is provided with a position target, the position of which is detected in order to determine the position of the respective antenna measuring probe.

4. The method according to claim 3, wherein the position of the position target is detected using a measuring laser beam, a measuring arm, an inertial measurement system, a geodetic measurement unit or a measuring method based on radio navigation.

5. The method according to claim 1, wherein an orientation of a respective antenna measurement probe is detected.

6. The method according to claim 1, wherein a respective antenna measurement probe is moved manually or using auxiliary devices that are not specific to antenna measurement.

7. The method according to claim 1, wherein a measurement point density and measurement point distribution are continuously visualized on an output.

8. The method according to claim 1, wherein the number of measurement points recorded is selected such that the density and distribution of the measurement points meets the requirements of the field transformation method used, which is based on a rapid and precise radiation integral calculation and in which the influence of the measurement probe on the signals to be measured is taken into account.

9. The method according to claim 1, wherein spatial reflections of the measured object are suppressed when determining the radiation pattern.

10. The method according to claim 1, wherein a respective antenna measurement probe is moved within a measurement volume that surrounds the radiation field and that extends perpendicular to the spread of the radiation field.

11. The method according to claim 1, wherein a respective antenna measurement probe is moved along a measurement plane surrounding the radiation field.

12. The method according to claim 1, wherein a respective antenna measurement probe is guided around the measured object.

13. A device for measuring a radiation field in an immediate vicinity of a measured object, the device comprising:
one or more antenna measurement probes that are movable within the radiation field for recording a number of high-frequency measurement points;
a position determiner by which at least one position determination of the antenna measurement probe(s) may be conducted simultaneously with or in close temporal proximity to the recording of each high-frequency measurement point, in order to assign a position to the respective high-frequency measurement point in order to generate a spatially defined measurement point cloud;
a computation unit that determines at least one radiation pattern of the measured object may be from the spatially defined measurement point cloud.

14. The device according to claim 13, wherein the antenna measurement probe comprises a frequency determiner that conducts a high-frequency measurement during the movement of a respective antenna measurement probe in order to record a respective measurement point.

15. The device according to claim 13, wherein a respective antenna measurement probe is provided with a position target, the position of which may be detected using measurement technology in order to determine the position of the antenna measurement probe.

16. The device according to claim 15, wherein the position of the position target is determined using a measuring laser beam, a measuring arm, an inertial measurement system, a geodetic measurer, or a measuring method based on radio navigation.

17. The device according to claim 13, wherein a respective antenna measurement probe is operable by hand or using auxiliary means that are not specific to antenna measurement.

* * * * *